United States Patent
Roehr et al.

(12) 
(10) Patent No.: US 6,584,009 B1
(45) Date of Patent: Jun. 24, 2003

(54) MEMORY INTEGRATED CIRCUIT WITH IMPROVED RELIABILITY

(75) Inventors: Thomas Roehr, Yokohama (JP); Hans-Oliver Joachim, Zushi (DE)

(73) Assignees: Infineon Technologies Aktiengesellschaft, Munich (DE); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/103,360

(22) Filed: Mar. 21, 2002

(51) Int. Cl.$^7$ .............................................. G11C 11/12
(52) U.S. Cl. ...................................... 365/145; 365/149
(58) Field of Search ................................ 365/145, 149, 365/117, 229, 227

(56) References Cited

U.S. PATENT DOCUMENTS 6,094,370 A * 7/2000 Takashima .................. 365/145
6,493,251 B2 * 12/2002 Hoya et al. .................. 365/145
6,507,510 B2 * 1/2003 Takashima ................... 365/145

* cited by examiner

*Primary Examiner*—Tan T. Nguyen
(74) *Attorney, Agent, or Firm*—Dexter Chin

(57) ABSTRACT

A chained memory IC in which a dual voltage scheme is used for operating the wordlines is described. During standby mode, the wordlines are maintained at a first logic 1 voltage level. To prepare for a memory access, the non-selected wordlines are driven to a boosted voltage while the selected wordline is driven to ground. The first logic 1 voltage level is less than the boosted voltage. This reduces the stress on the gate oxide of the transistors, thus improving reliability of the memory IC.

15 Claims, 4 Drawing Sheets

MEMORY INTEGRATED CIRCUIT WITH IMPROVED RELIABILITY

FIELD OF THE INVENTION

The present invention relates to ferroelectric memory integrated circuits (ICs). More particularly, the invention relates to improving the reliability of ferroelectric memory ICs configured in a chained architecture.

BACKGROUND OF THE INVENTION

Ferroelectric metal oxide ceramic materials such as lead zirconate titanate (PZT) have been investigated for use as ferroelectric capacitors of semiconductor memory devices. Other ferroelectric materials including, for example, stronthium bismuth tantalate (SBT) or bismuth lanthanum titanate (BLT) can also be used. The ferroelectric material is located between two electrodes to form a ferroelectric capacitor for storage of information. Ferroelectric capacitor uses the hysteresis polarization characteristic of the ferroelectric material for storing information. The logic value stored in the memory cell depends on the polarization of the ferroelectric capacitor. To change the polarization of the capacitor, a voltage which is greater than the switching voltage (coercive voltage) needs to be applied across its electrodes. The polarization of the capacitor depends on the polarity of the voltage applied. An advantage of the ferroelectric capacitor is that it retains its polarization state after power is removed, resulting in a non-volatile memory cell.

FIG. 1 shows a plurality of memory cells 105. The memory cells each comprising a transistor 130 coupled to a ferroelectric capacitor 140 in parallel. The memory cells are coupled in series to form a chain 103. Chained memory architectures are described in, for example, Takashima et al., "High Density Chain ferroelectric random access Memory (chain FRAM)", IEEE Jrnl. of Solid State Circuits, vol.33, pp.787–792, May 1998, which is herein incorporated by reference for all purposes. One end of a chain is coupled to a bitline 160 via a selection transistor 108 while the other end is coupled to a plateline 170. The gates of the transistors are coupled to respective wordlines 150. The bitline is coupled to a sense amplifier circuit to facilitate memory accesses (e.g., reads and writes).

FIG. 2 shows a timing diagram of a read operation for accessing a memory cell of the chain. Prior to T1, the memory cells are in standby mode. During standby mode, the BS signal is at a logic 0 (;ground or Vss), rendering the selection transistor non-conductive to decouple the chain from the bitline. The wordlines coupled to the gates of the memory cells are at a boosted high voltage level (Vpp), shorting the capacitors. The boosted voltage is greater than the internal voltage (Vint) of the IC. In particular, Vpp has to be sufficiently high to ensure sufficient overdriving during read or write operations. For example, Vpp is about 3.8 V while Vint is about 2.5 V.

At about T1, the wordline associated with the selected cell is driven to a logic 0 while the wordlines of the non-selected cells remain at Vpp. At about T2, the BS signal is driven to Vpp to couple the chain to the bitline. A pulse (Vpl which for example is about 2.5V) is then provided on the plateline until about T3. The pulse creates an electric field across the capacitor of the selected cell. A signal corresponding to the information stored in capacitor is then placed on the bitline and sensed by a sense amplifier. After the access is completed, the chain is decoupled from the bitline by driving BS to a logic 0 at T4. The selected wordline is then driven back to Vpp at T5, thus returning to the standby mode.

As shown by the timing diagram, the wordlines are maintained at Vpp during standby mode. Even during a memory access, only the wordline associated with the selected cell is driven to logic 0. Applying a boosted voltage to the gates almost constantly can adversely affect the reliability of the gate oxide, reducing service lifetime of the memory device.

From the foregoing discussion, it is desirable to provide a chained architecture with improved reliability.

SUMMARY OF THE INVENTION

The invention relates to improving reliability of memory ICs with chained architectures. In one embodiment, a multi-level voltage scheme is used to drive the wordlines. During standby mode, the wordlines are maintained at a first or reduced logic 1 voltage level. When a memory access is to be performed, the non-selected wordlines are driven to a boosted voltage level while the selected wordline is driven to Vss or logic 0. The boosted voltage level is greater than the first voltage level to ensure sufficient overdriving of the transistors of the memory cell. By providing a multi-level voltage scheme to operate the wordlines, the gates of the transistors are exposed to the high voltage only when necessary. This reduces stress on the gate oxide, thus improving reliability.

DETAILED DESCRIPTION OF THE INVENTION

Figure 1:
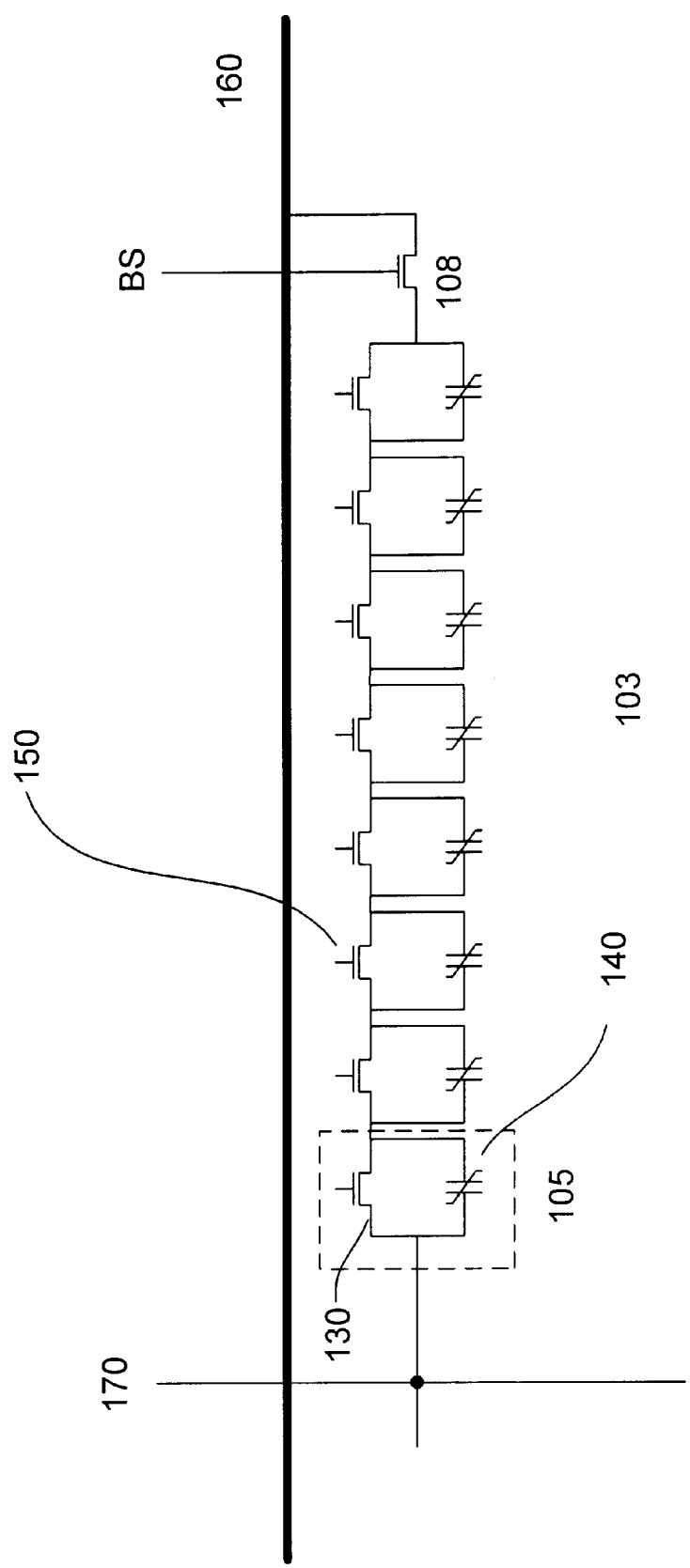
FIG. 1 shows a conventional memory chain.
Figure 2:
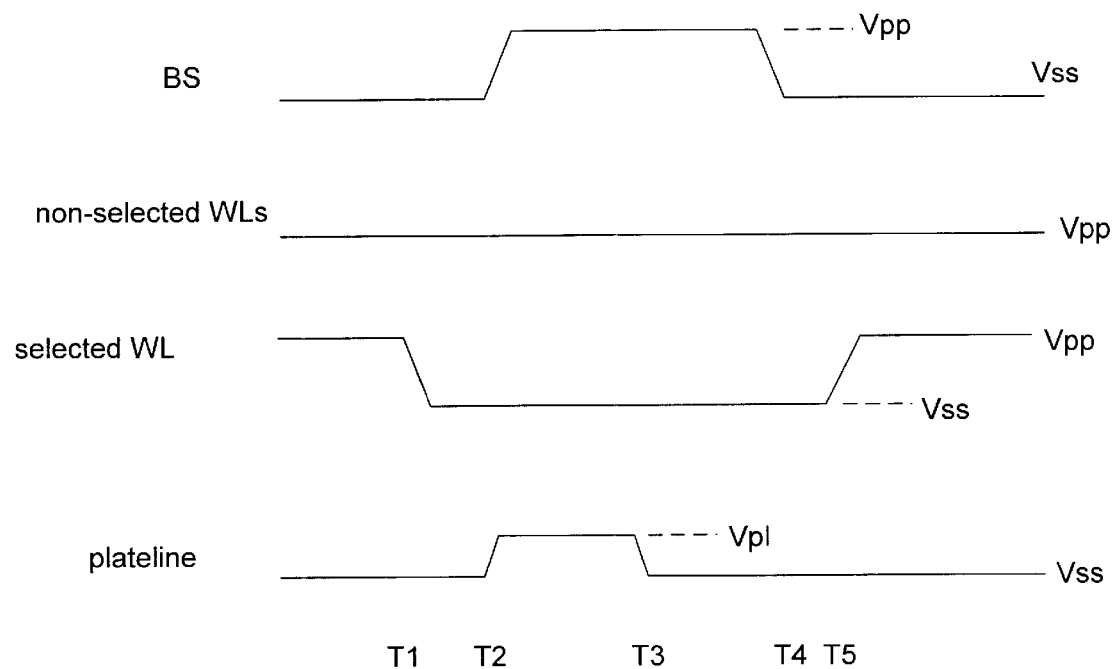
FIG. 2 shows a timing diagram of a memory access in chained architecture.
Figure 3:
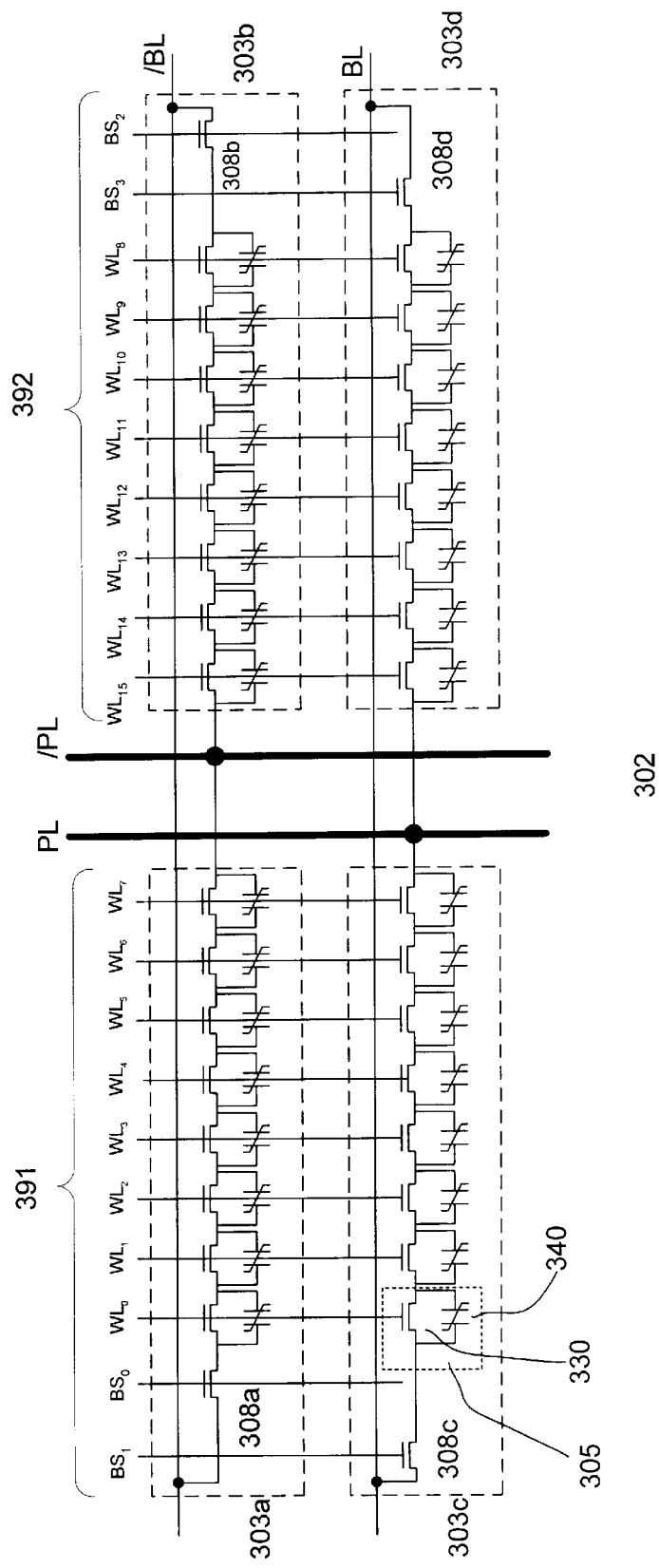
FIG. 3 shows a portion of a memory IC in accordance with one embodiment of the invention.

FIG. 3 shows a portion 302 of a memory IC in accordance with an embodiment of the invention. As shown, the portion includes a pair of bitlines (bitline BL and bitline complement /BL). Each bitline includes first and second series or chains of memory cells 303a–b or 303c–d). Providing a bitline with only one chain or other number of chains can also be useful. The memory cells of a chain, each with a transistor 330 coupled to a capacitor 340 in parallel, are coupled serially. In one embodiment, the memory cells are ferroelectric memory cells comprising ferroelectric capacitors. The gates of the cell transistors are, for example, gate conductors which serve as or are coupled to wordlines. A selection transistor 308 is provided to selectively couple one end of a memory chain to a bitline while the other end is commonly coupled to the other memory chain of the bitline and a plateline (PL or /PL).

In one embodiment, different control signals are used to operate the different selection transistors. For example, BS0 or BS1 is used to selectively couple either memory chain 303a or 303c to /BL or BL, respectively, when the left section 391 of the block is selected. If the right section 392 of the block is selected, BS2 or BS3 is used to selectively couple either memory chains 303c or 303d to /BL or BL, respectively. The BS signals are encoded with the chain address to select a cell on either the right or the left chain. PL is coupled to the memory chains of BL while /PL is coupled to the memory chains of /BL.

Numerous bitline pairs are interconnected via wordlines to norm a memory block. The memory block is separated into first (left) and second (right) sections 391 and 392, each comprising a chain of a bitline. During a memory access, one memory cell from a bitline pair is selected by selecting the appropriate wordline and BS signal.

In accordance with the invention, a multi-level Vpp scheme is employed to operate the wordlines. In one embodiment, a reduced Vpp voltage level (Vpp*) is used during standby mode. The reduced voltage is sufficient to render the cell transistors conductive to provide a low resistance channel to short the capacitor. During a memory access, reduced Vpp* is boosted to the Vpp level. In one embodiment, Vpp is about 3.8 V and Vpp* is about 2.5V. Vpp* for example, can be equal to Vint or other available voltage source having a voltage level below Vpp, such as dummy cell voltage source (e.g., 1.8V). By providing a two-level Vpp scheme for driving the wordlines, the high voltage stress associated with Vpp can be reduced, thus improving reliability.

Figure 4:
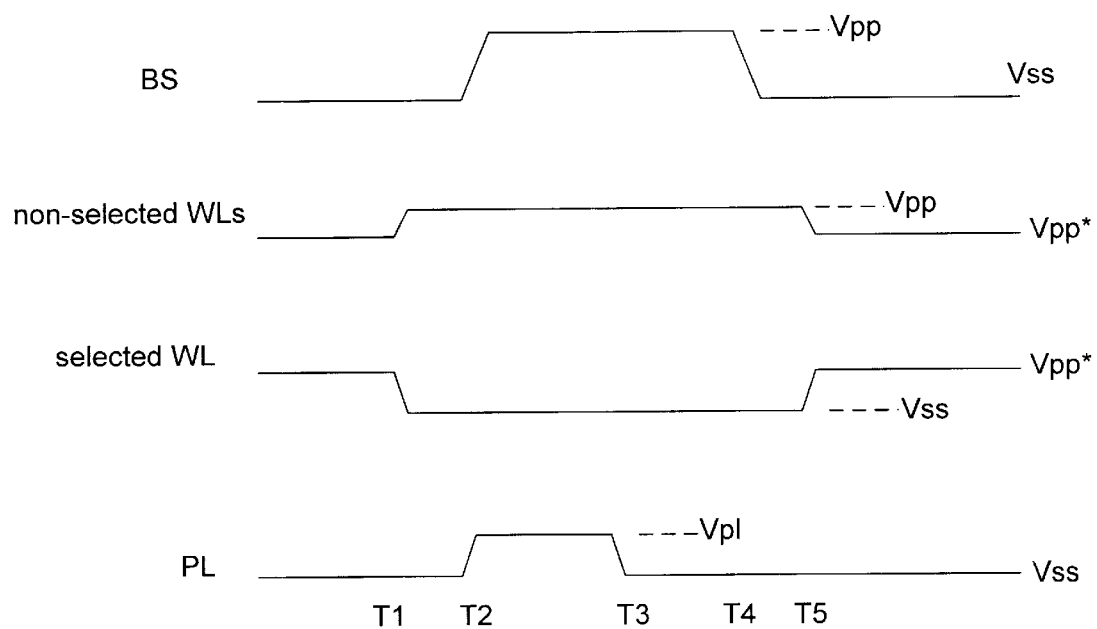
FIG. 4 shows a timing diagram for performing a memory access in accordance with one embodiment of the invention.

FIG. 4 shows a timing diagram of a memory access in accordance with one embodiment of the invention. During standby mode, BS is a logic 0, wordlines are at a reduced voltage Vpp*, and the plateline PL is at logic 0. At T1, in preparation of a memory access, non-selected wordlines are driven to Vpp while the selected wordline is driven to Vss. At T2, the BS signal is driven to a logic 1 to couple the selected chain to the bitline. To ensure overdriving the selection transistor, the BS signal is driven to Vpp. A pulse is then provided on the plateline PL from about T2 to T3. The pulse, for example, is about 2.5 V. The pulse creates an electric field across the capacitor of the selected cell. A signal corresponding to the information stored in capacitor is then placed on the bitline and sensed by a sense amplifier. After the access is completed, the chain is decoupled from the bitline by driving BS to a logic 0 at T4 and then, at T5, the wordlines are returned back to Vpp* (e.g., returning to the standby Lode).

While the invention has been particularly shown and described with reference to various embodiments, it will be recognized by those skilled in the art that modifications and changes may be made to the present invention without departing from the spirit and scope thereof. The scope of the invention should therefore be determined not with reference to the above description but with reference to the appended claims along with their full scope of equivalents.

What is claimed is:

1. A method of operating a memory IC in which memory cells are grouped in chains comprising:

maintaining wordlines of the memory IC at a first logic 1 voltage level during stand by mode;

increasing the wordlines to a second logic 1 voltage level in preparation for a memory access, wherein the second logic 1 voltage level is higher than the first logic 1 voltage level; and driving one of the wordlines associated with a selected memory cell to a logic 0.

2. The method of claim 1 wherein the capacitors of the memory cells comprise ferroelectric capacitors.

3. The method of claim 2 further comprising providing a pulse on a plateline coupled to one end of the memory chains.

4. The method of claim 1 wherein a memory chain includes a plurality of memory cells coupled in series to form the chain, wherein a memory cell of the chain includes a transistor coupled to a capacitor in parallel.

5. The method of claim 4 wherein the capacitors of the memory cells comprise ferroelectric capacitors.

6. The method of claim 5 further comprising providing a pulse on a plateline coupled to one end of the memory chains.

7. The method of claim 4 further comprising providing a pulse on a plateline coupled to one end of the memory chains.

8. The method of claim 1 further comprising providing a pulse on a plateline coupled to one end of the memory chains.

9. The method of claim 1 wherein operating the IC using first and second logic 1 levels for driving the wordlines improves reliability of the IC.

10. The method of claim 9 wherein the first logic 1 level is equal to about 2.5V and the second logic 1 level is equal to about 3.8V.

11. The method of claim 9 wherein the first logic 1 level is equal to about Vint, the internal voltage of the IC.

12. The method of claim 11 wherein the second logic 1 level is equal to about Vpp.

13. The method of claim 12 wherein the first logic 1 level is equal to about 2.5V and the second logic 1 level is equal to about 3.8V.

14. The method of claim 9 wherein the second logic 1 level is equal to about Vpp.

15. The method of claim 14 wherein the first logic 1 level is equal to about 2.5V and the second logic 1 level is equal to about 3.8V.

* * * * *

UNITED STATES PATENT AND TRADEMARK OFFICE
CERTIFICATE OF CORRECTION

| | | |
|---|---|---|
| PATENT NO. | : 6,584,009 B1 | Page 1 of 1 |
| APPLICATION NO. | : 10/103360 | |
| DATED | : June 24, 2003 | |
| INVENTOR(S) | : Roehr et al. | |

It is certified that error appears in the above-identified patent and that said Letters Patent is hereby corrected as shown below:

Title page,
Item [75], Inventors: should read --Thomas Roehr, Yokohama (JP)
                                          Hans-Oliver Joachim, Zushi (JP)
                                          Daisaburo Takashima, Tokyo (JP)
                                          Shinichiro Shiratake, Tokyo (JP)--.

Signed and Sealed this

Eighteenth Day of July, 2006

JON W. DUDAS
*Director of the United States Patent and Trademark Office*